US012690138B2

(12) United States Patent
Brewster et al.

(10) Patent No.: US 12,690,138 B2
(45) Date of Patent: Jul. 21, 2026

(54) SOLDER JOINT INSPECTION FEATURES

(71) Applicant: KOLLMORGEN CORPORATION, Radford, VA (US)

(72) Inventors: Jeffery Todd Brewster, Dublin, VA (US); Heather Cassidy Hawley, Blacksburg, VA (US); William Edward Anderson, IV, Blacksburg, VA (US); Tyler William Wood, Radford, VA (US); George Edward Midkiff, Pulaski, VA (US); Elizabeth Cantando, Blacksburg, VA (US)

(73) Assignee: KOLLMORGEN CORPORATION, Radford, VA (US)

( * ) Notice: Subject to any disclaimer, the term of this patent is extended or adjusted under 35 U.S.C. 154(b) by 252 days.

(21) Appl. No.: 17/989,989

(22) Filed: Nov. 18, 2022

(65) Prior Publication Data

US 2023/0164923 A1     May 25, 2023

Related U.S. Application Data

(60) Provisional application No. 63/281,327, filed on Nov. 19, 2021.

(51) Int. Cl.
H05K 1/02 (2006.01)
H05K 3/3465 (2026.01)

(52) U.S. Cl.
CPC ......... H05K 3/3465 (2026.01); H05K 1/0269 (2013.01); *H05K 2203/162* (2013.01); *H05K 2203/166* (2013.01)

(58) Field of Classification Search
CPC .... H05K 1/0266; H05K 1/0268; H05K 1/113; H05K 1/117; H05K 2201/09027;
(Continued)

(56) References Cited

U.S. PATENT DOCUMENTS 4,756,696 A    7/1988   Whiteman, Jr.
5,012,502 A    4/1991   Battin et al.
(Continued)

FOREIGN PATENT DOCUMENTS

CN      101706458 A    5/2010
JP     2006173282 A2    6/2006
(Continued)

OTHER PUBLICATIONS

"Integrated Test Via and Pad Design", IBM Technical Disclosure Bulletin, International business Machines Corp. (Thornwood), US, vol. 34, No. 3, Aug. 1, 1991, pp. 361-362, XP000210616.
(Continued)

*Primary Examiner* — Roshn K Varghese
(74) *Attorney, Agent, or Firm* — DAY PITNEY LLP; George N. Chaclas; Anthony A. Kassas

(57) ABSTRACT

A printed circuit board has a solder joint inspection system including a substrate surface having at least one solder pad thereon, at least one conductor wire having an end attached to the at least one solder pad, and a first inspection feature. A first inspection feature is marked on the substrate surface adjacent to the at least one solder pad to define a conductor end zone on the at least one solder pad. The end of the conductor wire is in the conductor end zone when properly attached. The at least one solder pad may define a second inspection feature to mark an extent to which the at least one solder pad is covered by a flow of solder when the wire is properly attached.

15 Claims, 10 Drawing Sheets

(58) Field of Classification Search

CPC .......... H05K 2201/09063; H05K 2201/09381; H05K 2201/0939; H05K 2201/09481; H05K 2201/0969; H05K 2201/09727; H05K 2201/09918; H05K 2201/10287; H05K 2201/09463; H05K 2201/0957; H05K 2203/046; H05K 2203/048; H05K 2203/043; H05K 2201/10356; H05K 2201/1028; H05K 1/0269; H01L 2224/04042; H02K 2203/03

See application file for complete search history.

(56) References Cited

U.S. PATENT DOCUMENTS

| | | | |
|---|---|---|---|
| 5,047,714 A * | 9/1991 | Maeno | H05K 1/0269 |
| | | | 324/73.1 |
| 5,108,024 A | 4/1992 | Kazem-Goudarzi et al. | |
| 5,164,994 A | 11/1992 | Bushroe | |
| 5,446,244 A * | 8/1995 | Kawanabe | H05K 1/111 |
| | | | 228/105 |
| 5,713,126 A | 2/1998 | Sakemi | |
| 5,809,641 A * | 9/1998 | Crudo | H05K 3/3436 |
| | | | 29/402.06 |
| 5,917,704 A | 6/1999 | Trublowski et al. | |
| 6,259,608 B1 * | 7/2001 | Berardinelli | H05K 1/111 |
| | | | 174/250 |
| 6,272,204 B1 | 8/2001 | Amtower et al. | |
| 6,479,755 B1 | 11/2002 | Kim et al. | |
| 7,005,750 B2 | 2/2006 | Liu | |
| 7,134,592 B2 | 11/2006 | Ensslin et al. | |
| 7,294,930 B2 * | 11/2007 | Tanabe | H01L 24/03 |
| | | | 257/E23.179 |
| 7,416,106 B1 | 8/2008 | Downes et al. | |
| 7,928,586 B2 * | 4/2011 | Tanabe | H01L 24/49 |
| | | | 257/784 |
| 8,428,339 B2 | 4/2013 | Wang et al. | |
| 9,250,198 B2 | 2/2016 | Ishigaki | |
| 9,814,135 B2 | 11/2017 | Nakamura | |
| 10,772,214 B2 | 9/2020 | Momose et al. | |
| 2006/0124702 A1 | 6/2006 | Oonishi | |
| 2008/0066955 A1 | 3/2008 | Nodo et al. | |
| 2009/0260853 A1 | 10/2009 | Nagaya et al. | |
| 2009/0279272 A1 | 11/2009 | Sun | |
| 2011/0262028 A1 | 10/2011 | Lipson et al. | |
| 2016/0164365 A1 * | 6/2016 | Yoneda | H02K 5/10 |
| | | | 310/71 |

FOREIGN PATENT DOCUMENTS

| | | |
|---|---|---|
| JP | 2014107424 A2 | 6/2014 |
| WO | 2012096004 A1 | 7/2012 |

OTHER PUBLICATIONS

International Search Report and Written Opinion in International Application No. PCT/US2022/050369, dated Apr. 3, 2023, 17 pages.

Thornwood, "Integrated Test Via and Pad Design", IBM Technical Disclosure Bulletin, International Business Machines Corp., vol. 34, No. 3, Aug. 1, 1991, pp. 361-362, XP000210616.

* cited by examiner

SOLDER JOINT INSPECTION FEATURES

CROSS-REFERENCE TO RELATED APPLICATIONS

The present application claims priority to U.S. Provisional Patent Application No. 63/281,327 dated Nov. 19, 2021, the contents of which are incorporated by reference herein in its entirety for all purposes.

FIELD OF THE DISCLOSURE

The subject disclosure relates to inspection of solders on printed circuit boards (PCBs), and more particularly to features to inspect conductor wire solder connections to solder pads.

BACKGROUND

Soldering delivers a robust and efficient bond between a solder pad of a PCB or a microchip and a conductor wire, enabling component integration and the attachment of electronic packages thereto. Soldering processes accommodate through-hole leaded components as well as surface-mounted packages.

When soldering conductor wire to a board, the solder joint formed requires inspection in order to avoid producing a defective connection, and thus a defective board. Some compromised solder joints are intermittent and problems only manifest when mechanical strain is applied to the PCB. Inspection is particularly critical due to ever-growing industry trends towards using surface mounted components. Solder joint inspection is typically a subjective determination of how much of conductor wire is placed on a solder pad, and how much solder needs to be applied thereto.

Solder joint inspection is required for the manufacturing of electronic components, systems and methods, particularly for the inspection of ball grid array solder contacts. X-rays have been employed to inspect solder joints because the penetrating illumination enables visualization of hidden features between an integrated circuit component and a printed circuit board. However, X-ray sources and detectors add unnecessary complexity to the process of inspecting visible solder joints. UV light and fluorescing materials may also be employed to aid in the inspection of solder joints. However, the integration of special materials to the manufacturing process requires compatibility testing and qualification for utilization, especially in applications requiring high reliability or those with environmental sensitivity.

Solder joint inspection methods often employ machine vision systems. In such systems, images of the solder joint to be inspected are acquired and stored digitally. A computational device then performs image processing, calculations, and or pattern matching against reference images stored in memory devices. These systems may attempt to calculate the height or volume of solder, the curvature of the exterior surface of the solder, or the contact angle between the solder and substrate. The criteria for the sufficiency of solder in these cases is based on a calculation that must be performed by a CPU. Comparisons are then made between the result of the calculation and a reference value stored in non-transitory memory.

Though, the quantity of solder present is not a sufficient criteria for determining the quality of a soldered contact. And, these methods introduce unnecessary sophistication, and as such, a system for solder joint quality inspection may be devised that eliminates the need for avoidable calculations.

The position of an electrically active component with respect to the solder pad on a printed circuit board is also critical to the functionality of the resulting circuit. Furthermore, encasing the conducting lead of an electrically active component is important for the structural integrity of the solder joint subject to mechanical stress. A system for inspecting both the position of the conducting lead with respect to the solder pad on a printed circuit board and the quantity of solder applied is desired to ensure high quality soldered connections.

The subject disclosure is contemplated for use in an electric motor such as a permanent magnet brushless motor that is disclosed by U.S. Pat. No. 7,105,973 BS, issued Sep. 12, 2006, the entirety of which is corporate by reference herein. The subject disclosure may also be implemented by those skilled in the art to other electric motor types and topologies including, but not limited to linear motors, outside rotating motors, hybrid steppers, permanent magnet steppers, variable reluctance motors, switched reluctance motors, or other polyphase electric motors.

An electric motor using a printed circuit board with solder joint inspection features includes a rotor and a stator having a plurality of coils wrapped thereon, the coils comprising field windings. The plurality of field winding coils may be wound around one or more stator teeth but may also be wound into a slat-less stator that does not include individual stator teeth.

The field windings of the electric motor stator are of any material capable of conducting electricity, preferably insulated conductors called magnet wire. The separate stator field winding coils may be connected in either series groups or in parallel groups to achieve the appropriate winding parameters necessary for the application of the electric motor.

Electric motors may have single or multi-phase windings, and it is common for multiphase stators to be connected in either a star-wye connection pattern or a delta connection pattern with each motor phase having one or more stator field windings coils.

The interconnections of the electric motor's individual field windings into series and/or parallel groups and those groups further into either a star-wye or delta connection maybe done using a printed circuit board.

Individual conducting magnet wires of the electric motor's field windings must be securely soldered on to the printed circuit board, which then will use the subject disclosure described herein to confirm the quality of the solder joint.

The flow of current into the field windings can be controlled and adjusted by motor control electronics to produce a desired magnetic field and corresponding motor performance.

SUMMARY

The subject technology is directed to a printed circuit board (PCB) having a solder joint inspection system. The printed circuit board includes a substrate surface having at least one solder pad thereon, at least one conductor wire having an end attached to the at least one solder pad, and a first inspection feature marked on the substrate surface. The first inspection feature is adjacent to the at least one solder pad to define a conductor end zone on the at least one solder pad. The end of the conductor wire is in the conductor end zone when properly attached.

In one embodiment, the at least one solder pad may define a second inspection feature to mark an extent to which the at least one solder pad is covered by a flow of solder when the wire is properly attached. The at least one solder pad may include a proximal end, a distal end, and a lateral side extending between the proximal end and distal end. The second inspection feature may include a notch disposed on the lateral side of the at least one solder pad. The first inspection feature may be silkscreened onto the substrate surface.

The subject technology is directed to a method of inspecting a solder joint including providing a substrate surface having at least one solder pad. The method includes forming a first inspection feature on the substrate surface adjacent to the at least one solder pad to define a conductor end zone on the at least one solder pad, and providing an end of a conductor wire in the conductor end zone. The method includes inspecting the position of the conductor wire, and thereafter flowing solder over the at least one solder pad to create a solder joint. The method includes inspecting the solder joint in view of a second inspection feature on the at least one solder pad. The second inspection feature marks an extent to which the at least one solder pad is covered by a flow of solder when the wire is properly attached.

In one embodiment, the first inspection feature may include silkscreening the first inspection feature onto the substrate surface. The at least one solder pad may include a proximal end, a distal end, and a lateral side extending between the proximal end and distal end. The second inspection feature may include a notch disposed on the lateral side of the at least one solder pad.

BRIEF DESCRIPTION OF THE DRAWINGS

Various aspects of the present disclosure are discussed herein with reference to the accompanying Figures. It will be appreciated that for simplicity and clarity of illustration, elements shown in the drawings have not necessarily been drawn accurately or to scale. For example, the dimensions of some of the elements can be exaggerated relative to other elements for clarity or several physical components can be included in one functional block or element. Further, where considered appropriate, reference numerals can be repeated among the drawings to indicate corresponding or analogous elements. For purposes of clarity, however, not every component can be labeled in every drawing. The Figures are provided for the purposes of illustration and explanation and are not intended as a definition of the limits of the disclosure.

DETAILED DESCRIPTION

Figure 1:
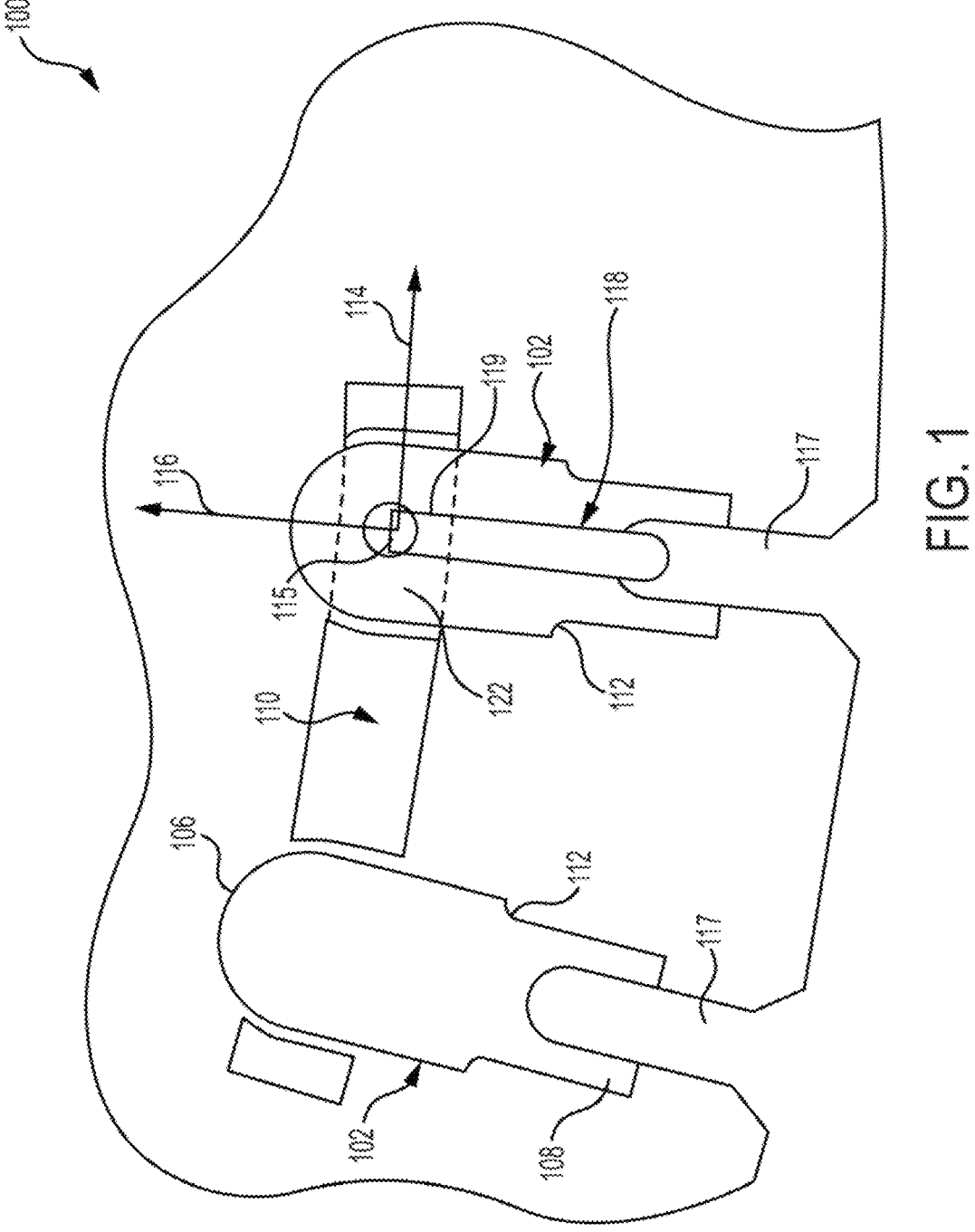
FIG. 1 is an overhead perspective view of two solder pads defined by a printed circuit board.

The subject technology overcomes many of the prior art problems associated with solder joint inspection. The advantages, and other features of the technology disclosed herein, will become more readily apparent to those having ordinary skill in the art from the following detailed description of certain exemplary embodiments taken in combination with the drawings and wherein like reference numerals identify similar structural elements. It should be noted that directional indications such as vertical, horizontal, upward, downward, right, left and the like, are used with respect to the figures and not meant in a limiting manner.

A coordinate system is used herein to help characterize embodiments of the printed circuit board 100. For example, a transverse axis 114 and an axial axis 116 are referenced. The transverse axis 114 is disposed at a 90 degree angle relative to the axial axis 116 and defines a lateral direction of the printed circuit board 100. The axial axis 116 is disposed at a 90 degree angle relative to the transverse axis 114 and defines an axial direction along the length of a conductor wire 118. A vertical axis 115 is disposed at a 90 degree angle relative to the transverse axis 114 and axial axis 116 and defines a thickness of the printed circuit board 100 for example.

FIG. 1, illustrates a conventional printed circuit board 100 which may include one or more typical flat laminated composites made from non-conductive substrate materials with one or more layers of copper circuitry buried internally or on an external surface. The circuit board may include a top surface and a bottom surface with conventional conductors etched on either the top or bottom surfaces.

In some embodiments, the printed circuit board 100 may be amenable to through-hole technology. In turn, the printed circuit board 100 may include a number of plated or non-plated through-holes which provide electrical continuity through the printed circuit board 100, referred to herein as vias. The vias include the electrical interconnection between layers of the printed circuit board 100 that are otherwise insulated in the laminate structure, and provide for a third dimension of connection between conductive layers in a controlled manner.

In the embodiment shown in FIG. 1, the printed circuit board 100 is amenable to surface-mount technology. The printed circuit board 100 may mechanically support surface-mounted electronic components in designated locations by soldering the electronic components to the printed circuit board 100. The electronic components may include integrated circuits, or discrete components, such as resistors and diodes. Where an electronic component is to be placed on the printed circuit board 100, the printed circuit board 100 may have, define, or otherwise contain a flat, usually tin-lead, silver, or gold plated copper pad, referred to herein as a solder pad 102.

The solder pad 102 embodied on the printed circuit board 100 is an exposed region, typically including metal, that an electronic component lead, referred to herein as a conductor wire 118, can be soldered to. The conductor wire 118 may pass through a slot 117 in the edge of a printed circuit board 100 and connect to a chip, resistor, capacitor, amplifier, diode, or other electronic component. The conductor wire 118 may be a magnet wire or sensor wire for an electric motor for which the printed circuit board 100 makes electric connection. In one embodiment, the conductor wire 118 is a strippable magnet conductor wire. As such, insulation is removed from the conductor wire 118 before making the solder connection to the printed circuit board 100. In another embodiment, the conductor wire 118 is a magnet conductor wire that does not require stripping before making the solder connection to the printed circuit board 100.

Solder pad 102 may include a surface mount pad such that surface mounted electronic components may be soldered directly to the printed circuit board 100. Alternatively, solder pad 102 may include a plated or non-plated thru-hole pad such as when the printed circuit board 100 is amenable to through-hole technology.

The solder pad 102 embodies a shape having a semi-circular portion defining a proximal end 106 of the solder pad 102, in conjunction with a rectangular portion defining a distal end 108. The shape of the solder pad 102 resembles that of a Norman window, wherein the rectangular distal end 108 has a length dimension, extending in the transverse direction 114 of FIG. 1, which is less than a length dimension, also extending in the transverse direction 114 of FIG. 1, of the semi-circular proximal end 106. In other embodiments, the solder pad 102 may embody the shape of an elongated semi-circle, a rectangle with two rounded corners, a rectangle with a semi-circular top portion, or a similar shape. Alternatively, the solder pad 102 may include: a square or rectangular solder pad 102, used in conjunction with large and few circuit board components; a circular solder pad 102, typically used in single and double-sided printed circuit boards 100 with regularly arranged components; an island-shaped solder pad 102, typically used in a vertical irregular arrangement; a teardrop solder pad 102, often used in high-frequency circuits; a polygonal solder pad 102, used to distinguish pads with close outer diameter but different apertures for easy processing and assembly; an oval solder pad 102 used in dual in-line devices; or an open-shaped solder pad 102. In yet another embodiment, the solder pad 102 may embody any shape feasible for the printed circuit board 100 application.

Figure 2:
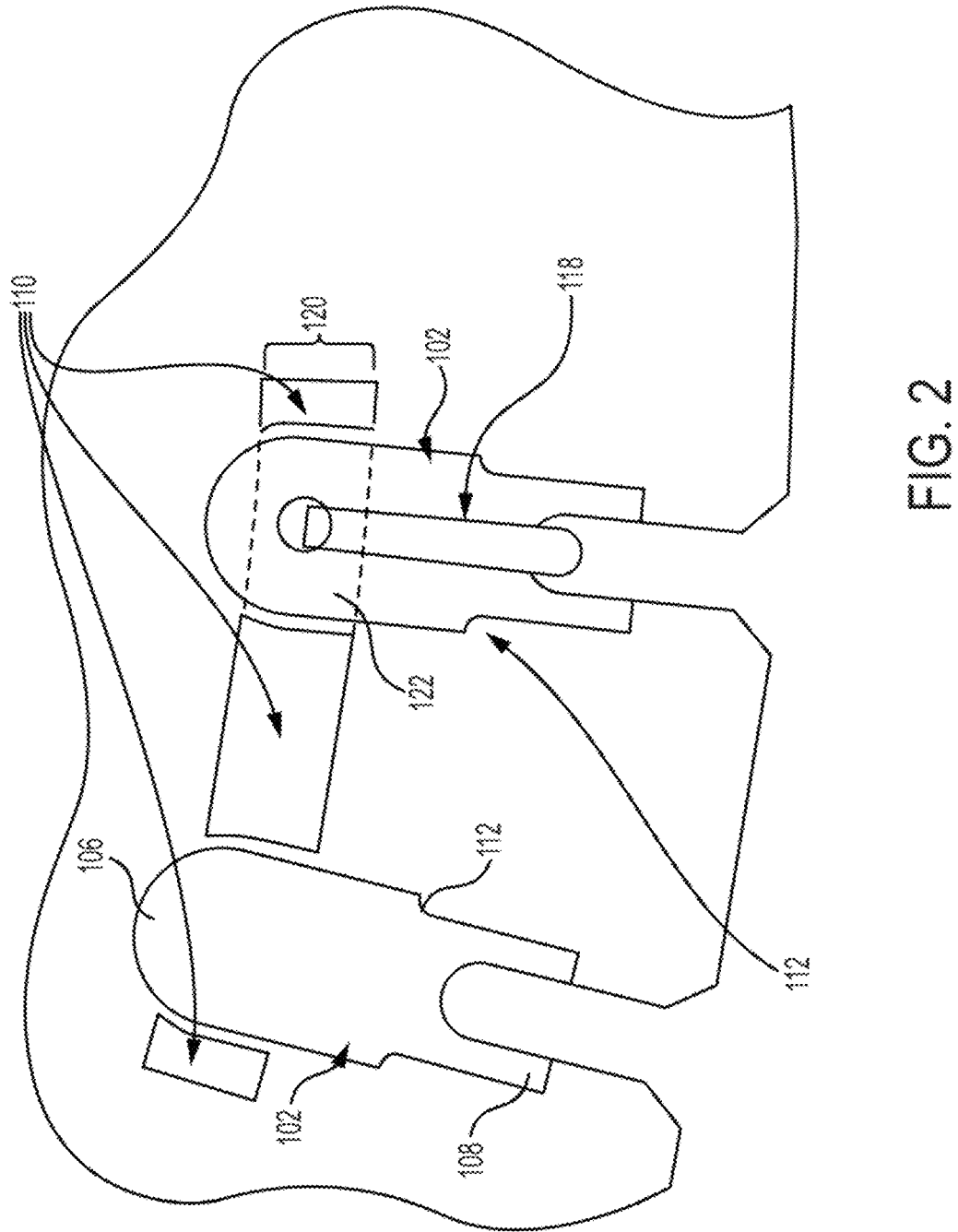
FIG. 2 is an overhead perspective view of the two solder pads of FIG. 1, including a conductor end zone.

Referring now to FIGS. 1 and 2 together, the printed circuit 100 includes a solder joint inspection system. The solder joint inspection system includes a first inspection feature 110 and a second inspection feature 112.

The first inspection feature 110 is printed, inked, marked, screened, silkscreened, scored, stained, shaped, or otherwise indicated on the printed circuit board 100. The first inspection feature 110 on the printed circuit board 100 is adjacent or proximate to the solder pad 102 to define a conductor end zone 122. In this regard, by referencing the first inspection feature 110, a conductor end zone 122 may be defined on the solder pad 102 by an inspector. The conductor end zone 122 marks an appropriate area for the end portion 119 of the conductor wire 118 to make contact with the solder pad 102.

In one embodiment, the first inspection feature 110 includes a white fiducial marking silkscreened onto the printed circuit board 100 surface, adjacent to the solder pad 102. The first inspection feature 110 may be visually transposed onto the solder pad 102, defining the conductor end zone 122 within which the end portion 119 of the conductor wire 118 must be positioned for proper attachment. As such, the first inspection feature 110 can be referenced by an inspector when determining if an adequate length of conductor wire 118 is disposed on the solder pad 102.

The first inspection feature 110 includes a length 120, as shown in FIG. 2. The length 120 dimension extends in the axial direction 116 as depicted in FIG. 1. The length 120 provides a first dimension of the conductor end zone 122, while the width in the transverse direction of the solder pad 102 defines a second dimension of the conductor end zone 122.

The first inspection feature 110 extends along the transverse direction 114 relative to the solder pads 102 and conductor wire 118, whereas the conductor wire 118 extends along an axial direction 116. Though it will be appreciated by one of pertinent skill in the art that the first inspection feature 110 may extend along a transverse 114 or axial 116 direction relative to the conductor wire 118, the printed circuit board 100, the solder pad 102, or another point of reference.

Figure 3:
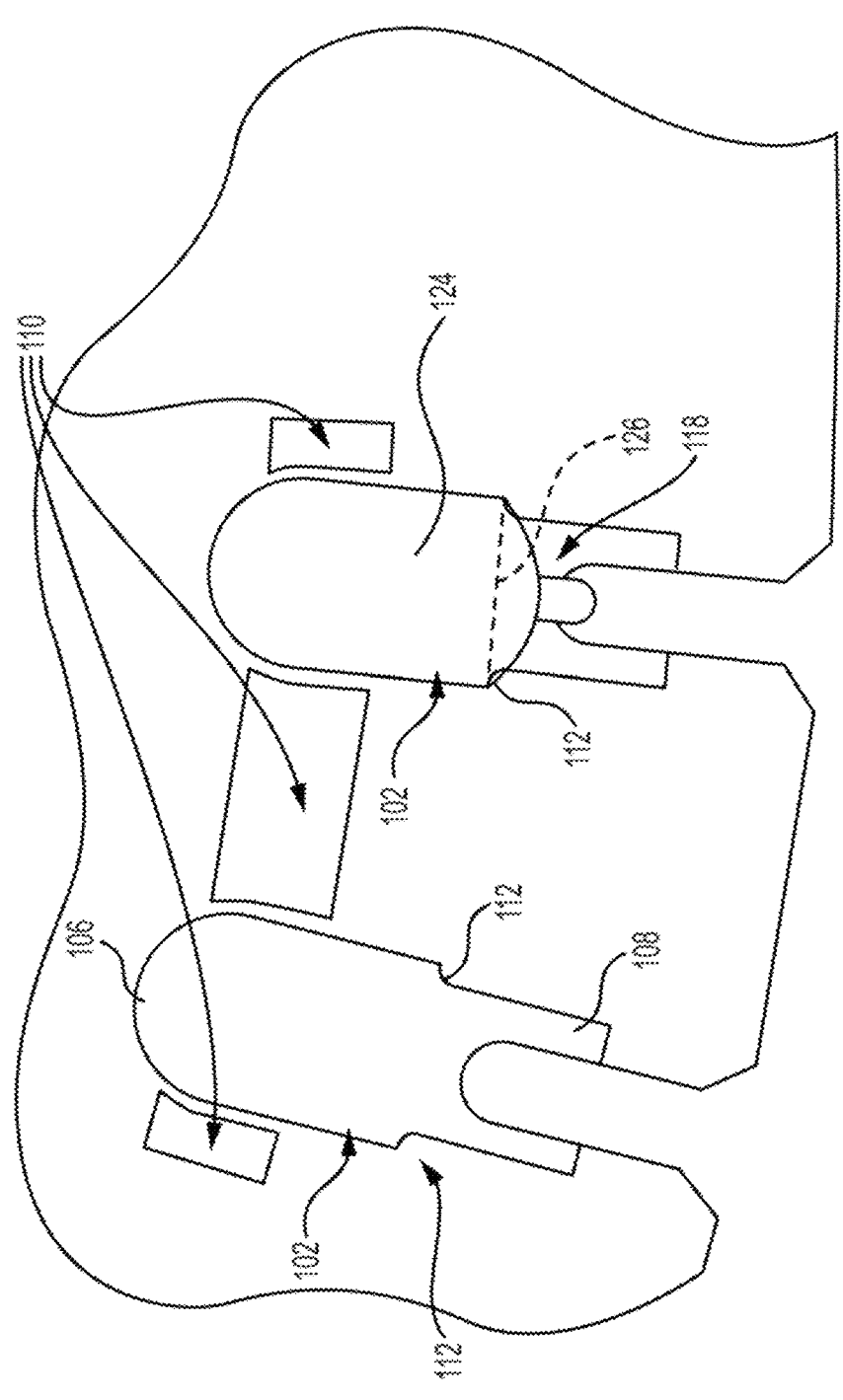
FIG. 3 is an overhead perspective view of a solder joint formed on one of the two solder pads of FIG. 1.

Referring now to FIG. 3, the second inspection feature 112 of the solder joint inspection system is defined by the solder pad 102. The second inspection feature 112 marks an extent to which the solder pad 102 is covered by a flow of solder when a conductor wire 118 is properly attached.

The second inspection feature 112 may include a v-shaped, u-shaped, circular, straight, or other shaped notch, indentation, or step in the solder pad 102. In another embodiment, the second inspection feature 112 may include an indicator that is printed, inked, marked, screened, silkscreened, scored, stained, shaped, or otherwise indicated on the printed circuit 100 instead of, or in addition to, the solder pad 102. The second inspection feature 112 may preferably be disposed on a lateral side of the solder pad 102, the lateral side including a sidewall or peripheral of the solder pad 102, extending between the proximal end 106 and the distal end 108 of the solder pad 102. However, any surface or location of the solder pad 102 may suffice as a second inspection feature 112 position.

The second inspection feature 112 may be disposed on more than one lateral side of the solder pad 102. In this regard, in some embodiments, the solder pad 102 is symmetrical, including two second inspection features 112 formed on opposing lateral sides of the solder pad 102, separated along the transverse direction 114. In such an embodiment, the second inspection features 112 may define an indicator line 126 therebetween to show the extent to which the solder pad 102 is covered by a flow of solder when the conductor wire 118 is properly attached.

Relative to the length of the solder pad 102, that is, the axial direction 116 defined in FIG. 1, the second inspection feature 112 may be disposed at a point on the solder pad 102 that is 0%, 5%, 10%, 15%, 20%, 25%, 30%, 35%, 40%, 45%, 50%, 55%, 60%, 65%, 70%, 75%, 80%, 85%, 90%, 95%, or 100% the length of the solder pad 102. For example, in the embodiment shown in FIG. 3, the second inspection feature 112 is disposed at a point on the solder pad 102 that is roughly 40% of the length of the solder pad 102. Depending on the solder pad 102, the conductor wire 118, or the electronic component to be mounted to the printed circuit board 100, the second inspection feature 112 may be adjusted in order to mark an appropriate amount of solder for the application.

Referring now to FIGS. 1-3 together, in operation, the solder joint inspection system provides a method of inspecting a solder joint 124. As discussed prior, a substrate surface on the printed circuit board 100 is provided having at least one solder pad 102 defined by, attached to, or otherwise on the printed circuit board 100. The first inspection feature 110 is formed on the substrate surface, adjacent to the at least one solder pad 102 to define the conductor end zone 122 on the at least one solder pad 102. In order to affix a surface-mounted electronic component (not shown) or to the printed circuit board 100, an end of a conductor wire 118 of the electronic component is provided in the conductor end zone 122, marking a proper length or portion of conductor wire 118 that must be affixed to the solder pad 102 for proper connection. Similar to the surface-mounted electronic component, in order to affix a conductor wire 118 of an electric motor to the printed circuit board 100, the end of a conductor wire 118 of the electronic component is provided in the conductor end zone 122, marking a proper length or portion of conductor wire 118 that must be affixed to the solder pad 102 for proper connection.

Thereafter, the position of the conductor wire 118 may be inspected to ensure an end of the conductor wire 118 is within the conductor end zone 122 of the solder pad.

The conductor wire 118 may then be attached to the board through a variety of heating techniques, including laser soldering, induction soldering, fiber focus infrared soldering, resistance soldering, active soldering, silver soldering, mechanical and aluminum soldering, hand soldering, wave soldering, reflow soldering, and brazing. As such, flowing solder over the at least one solder pad 102 creates the solder joint 124. The solder joint 124 may be inspected in view of the second inspection feature 112 on the at least one solder pad 102. This is because the second inspection feature 112 marks an extent to which the at least one solder pad 102 is covered by a flow of solder when the conductor wire 118 is properly attached. If the solder does not extend to the second inspection feature 112, then the solder joint 124 can be resoldered.

In a preferred example, the printed circuit board 100 is subjected to reflow soldering. A solder paste is used to temporarily attach the conductor wire 118 to the solder pad 102, after which the entire printed circuit board 100 is subjected to controlled heat. The solder paste eventually reaches the eutectic temperature at which the particular alloy composing the solder paste undergoes a phase change to a liquid or molten state. The solder paste thereafter exhibits properties of adhesion, thus creating one or more permanent or semi-permanent solder joints 124, joining the conductor wire 118 and the solder pad 102. The second inspection feature 110 shows the extent to which the solder paste covers the conductor wire 118 on the solder pad 102 following the reflow soldering process.

Figure 4A:
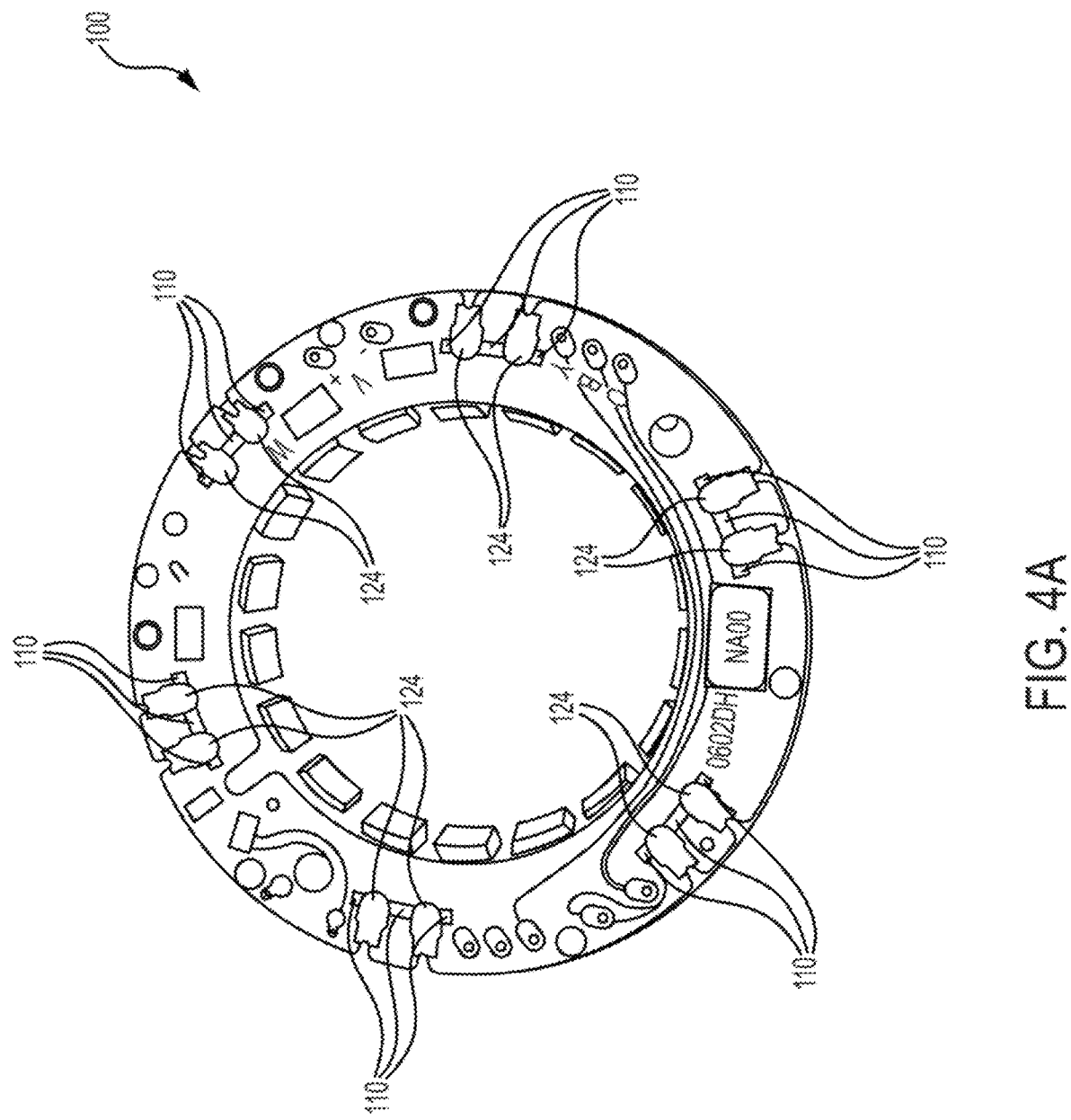
FIG. 4a-4b are overhead and side perspective views of a printed circuit board used in a motor assembly with solder joint inspection features as described herein.
Figure 4B:
Figure 4B:
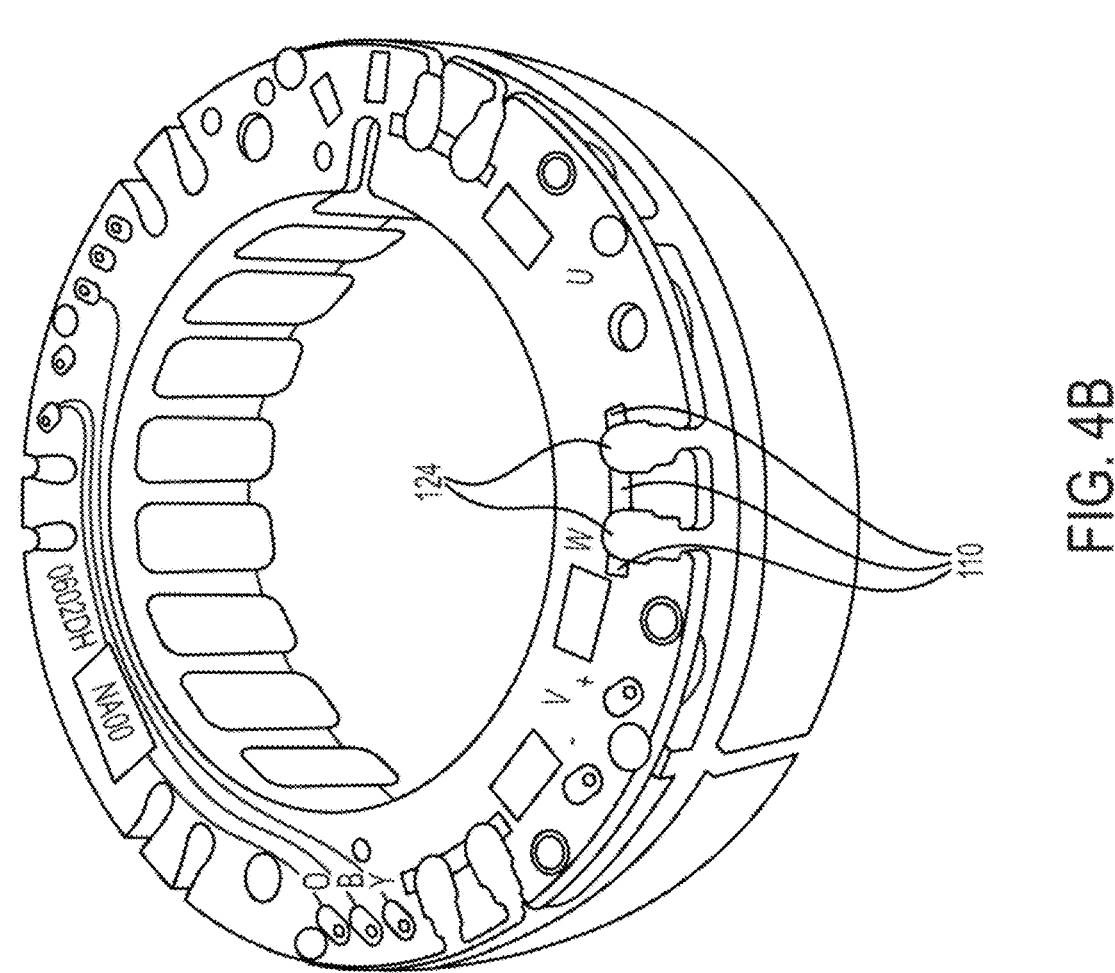
Figure 5:
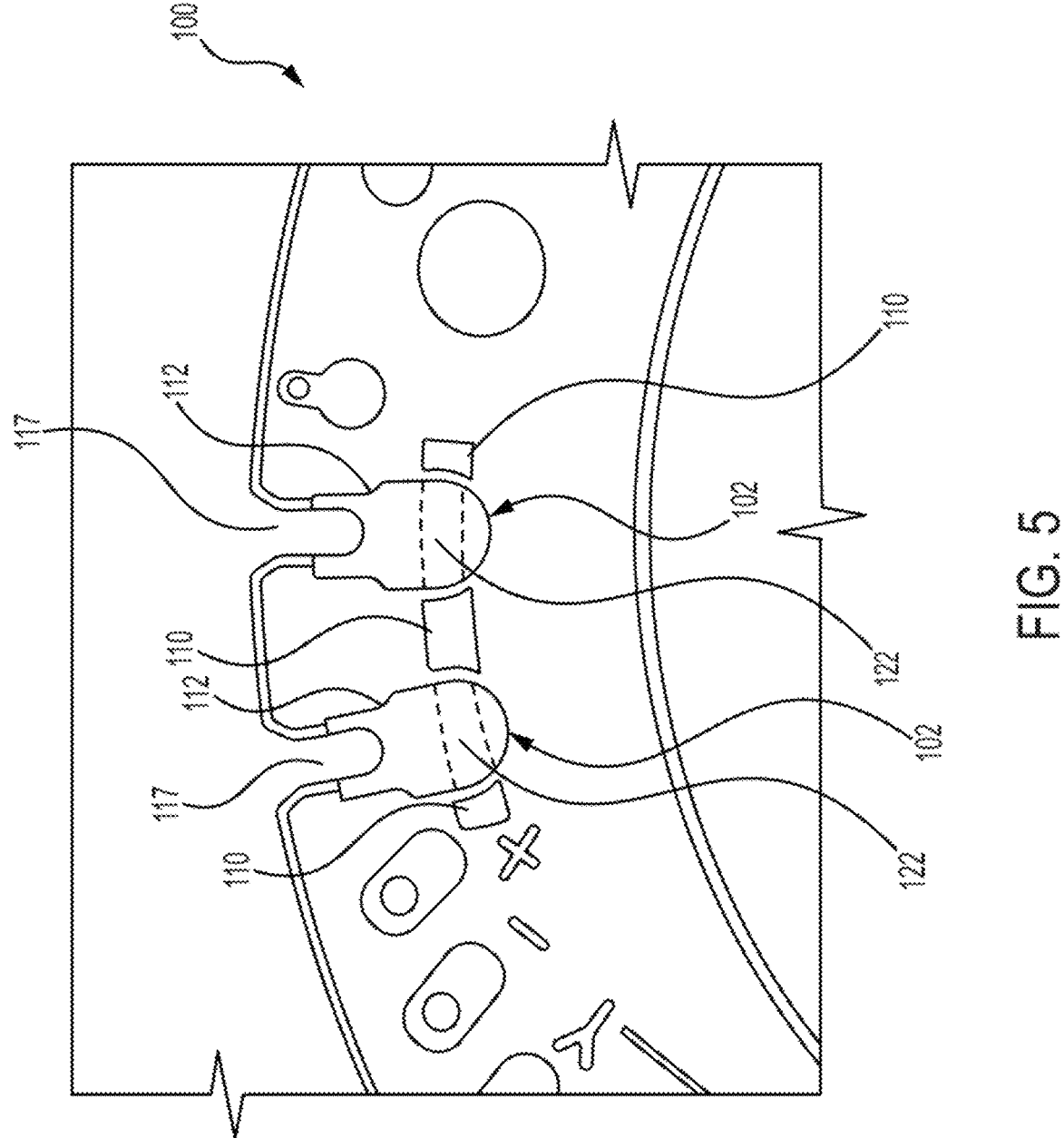
FIG. 5 is a close-up view of two solder pads defined by a printed circuit board, including a conductor wire end zone.

Referring now to FIGS. 4*a*, 4*b*, and FIG. 5, overhead, side, and close-up views of a printed circuit board 100 for an electric motor are shown in accordance with the subject disclosure. The printed circuit board 100 makes an electrical connection with conductor magnet wires of the electric motor's field windings. As shown in greater detail with respect to FIG. 5, the printed circuit board 100 includes one or more solder pads 102 and a first inspection feature 110 silkscreened adjacent thereto. The conductor end zone 122 is apparent on the solder pad 102 based on the location of the first inspection feature 110 relative to the solder pad 102 and the printed circuit board 100. The first inspection feature 110 aids in solder joint 124 inspection of the electrical connection between the conductor magnet wires of the electric motor's field windings and the printed circuit board 100.

Figure 6A:
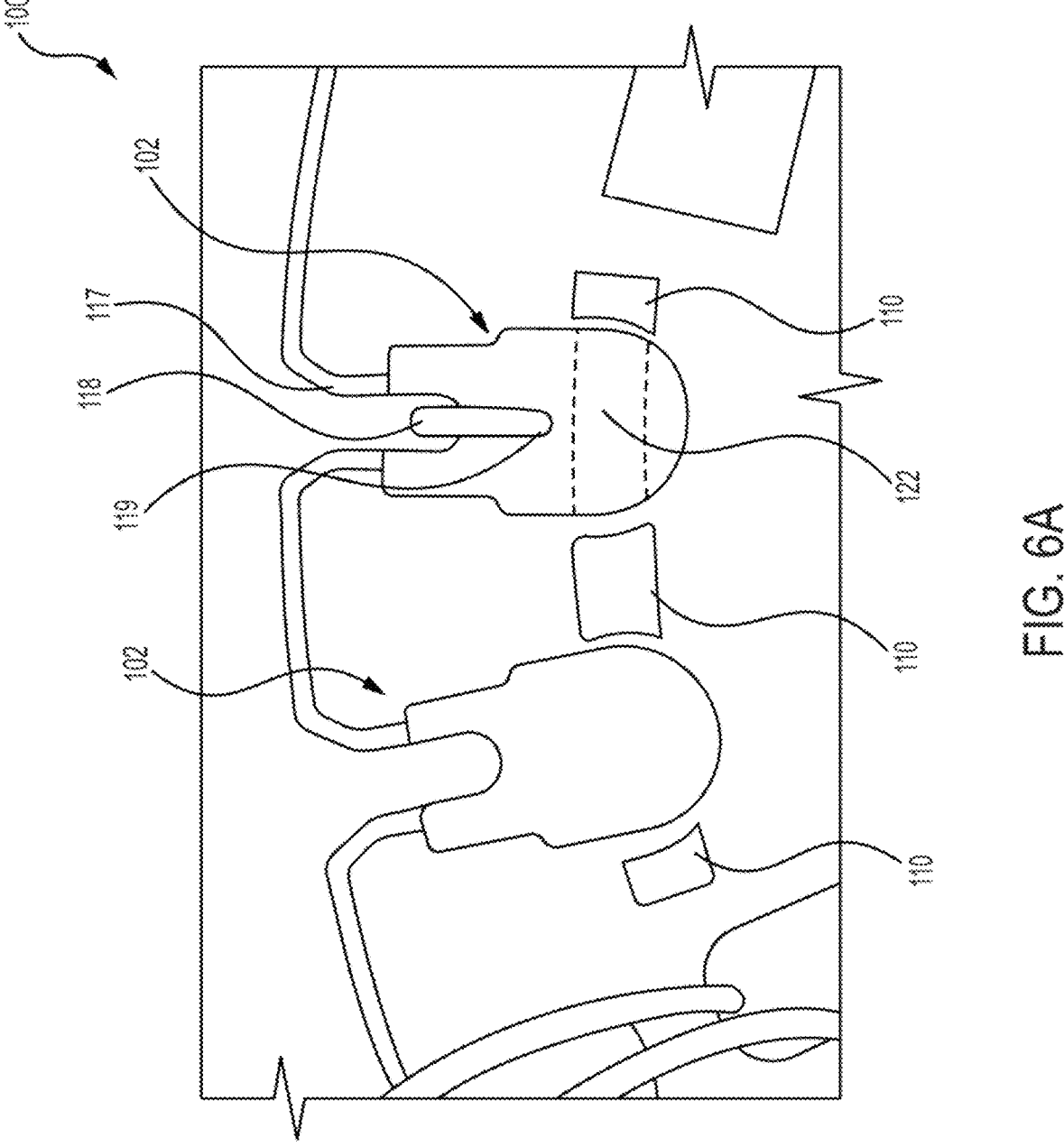
FIG. 6a is a close-up view of two solder pads defined by a printed circuit and a conductor wire positioned outside of the conductor wire end zone.
Figure 6B:
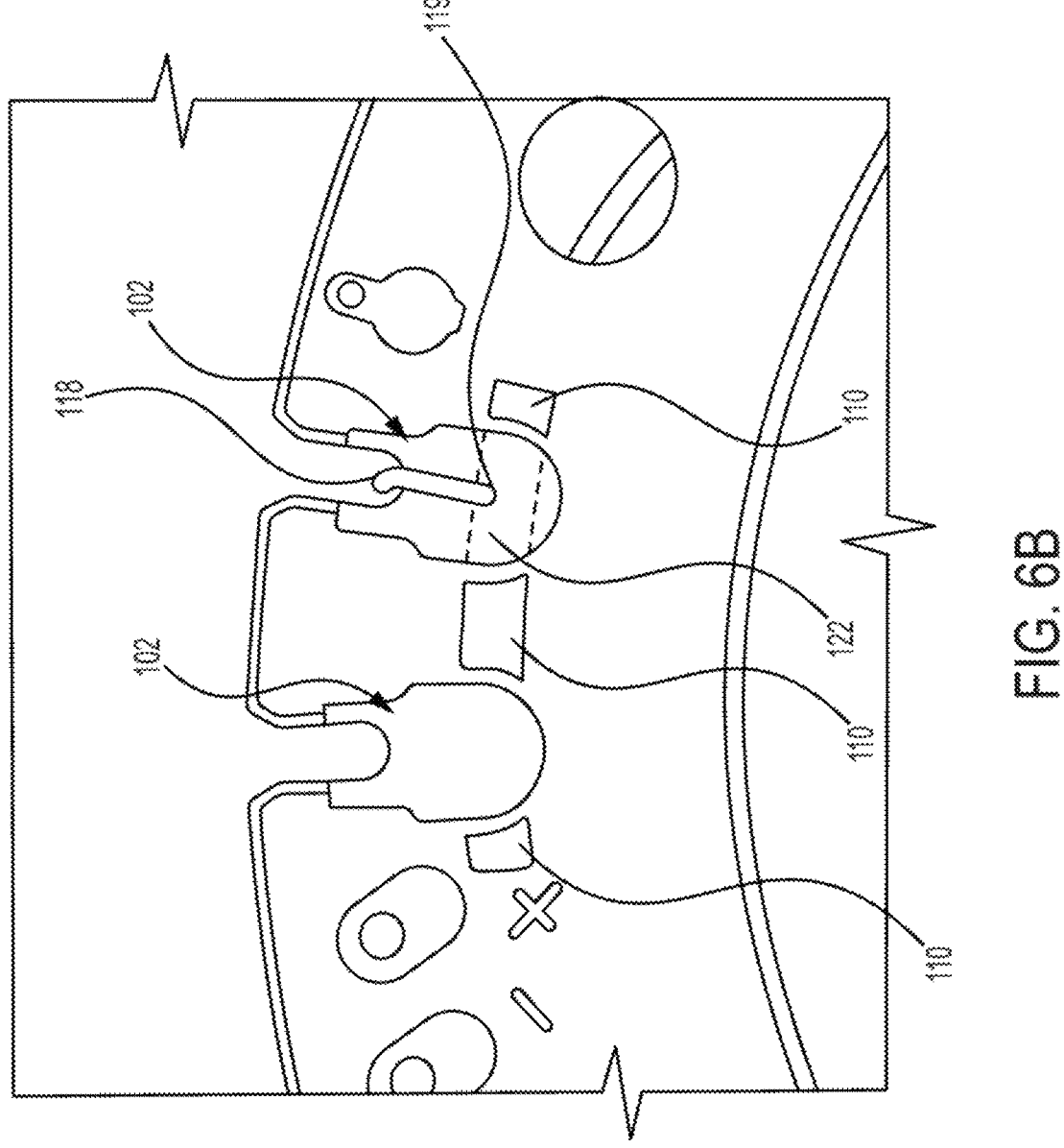
FIG. 6b is a close-up view of two solder pads defined by a printed circuit and a conductor wire positioned inside of the conductor wire end zone.

Referring now to FIG. 6*a*, a slot 117 is defined by the circuit board, through which a conductor wire 118 is fed. The end portion 119 of the conductor wire 118 is located outside of the conductor end zone 122. By marking or noting the conductor end zone 122 defined by the first inspection feature 110, an inspector can adjust the position of the end portion 119 of the conductor wire 118 to that shown in FIG. 6*b* to ensure a higher probability of an operational solder joint.

8

Figure 7A:
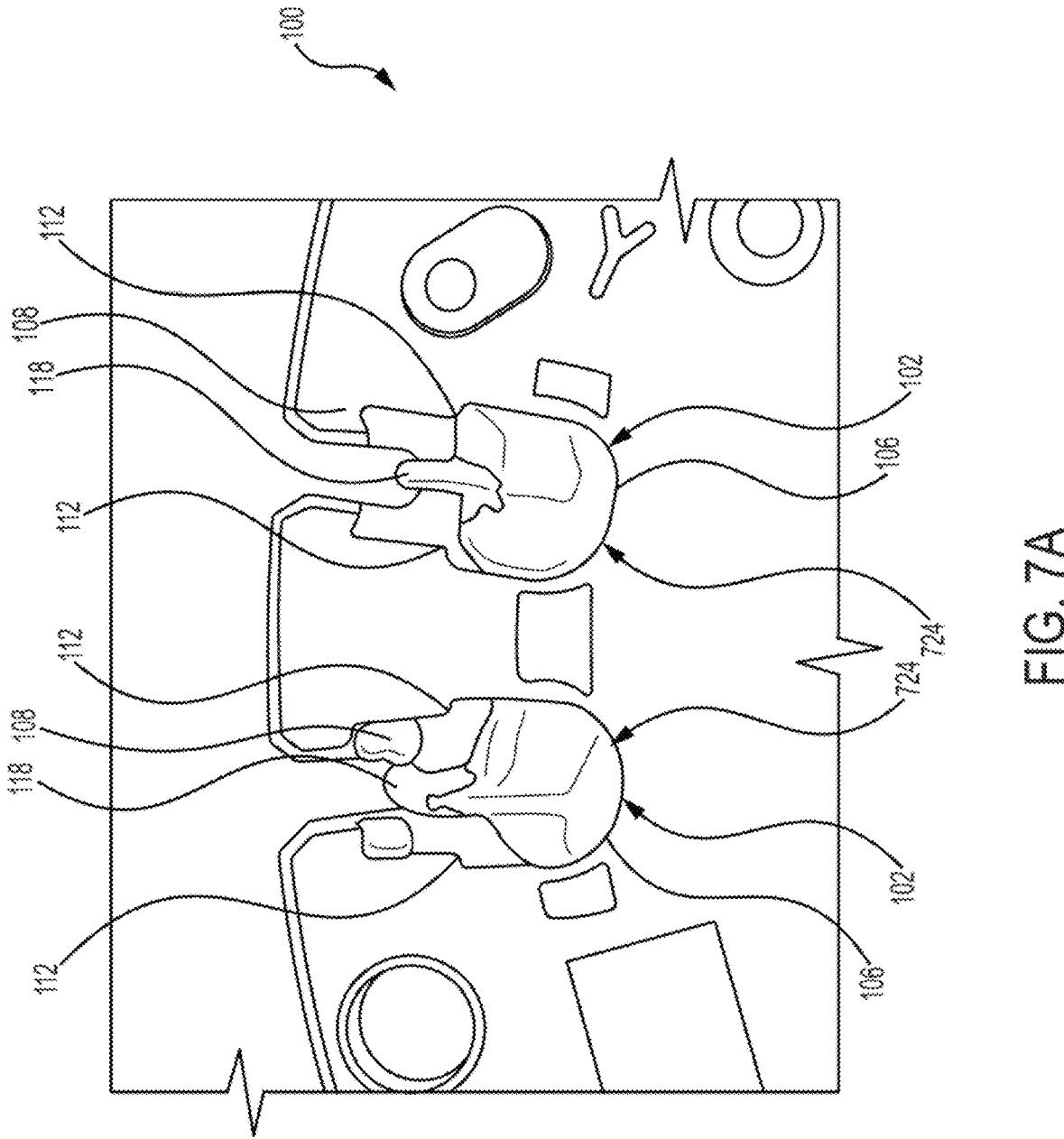
FIG. 7a is a close-up view of two defective solder joints, requiring a reflow of solder.
Figure 7B:
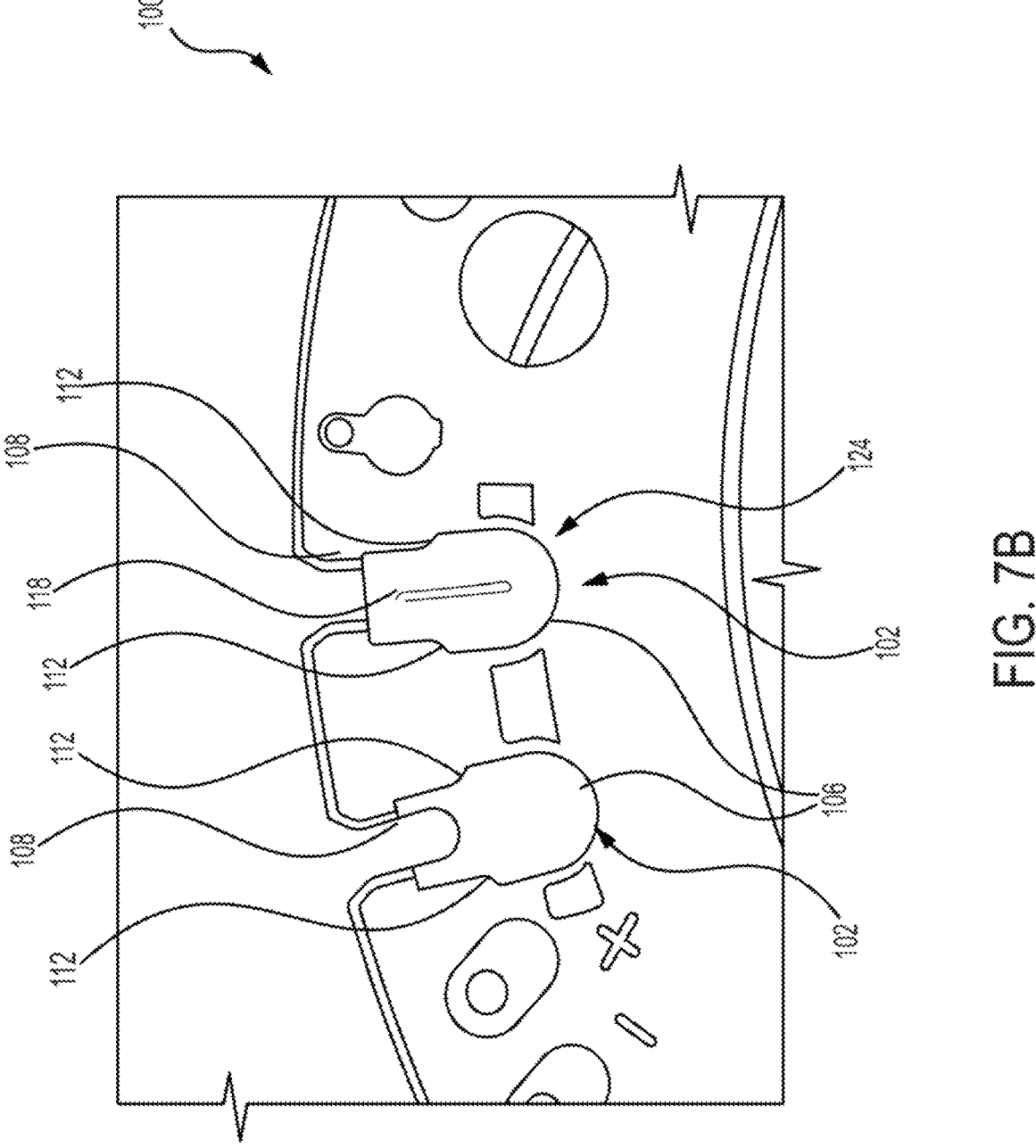
FIG. 7b is a close-up view of one proper solder joint, where solder has flowed beyond a second inspection feature.

Referring now to FIG. 7*a*, a close-up view of two defective solder joints 724 is depicted. The second inspection feature 112, marks an extent to which the solder pads 102 are covered by a flow of solder when the conductor wire 118 is properly attached. In comparison to FIG. 7*b*, the flow of solder in FIG. 7*a* did not reach the second inspection feature 112 while flowing from the proximal end 106 of the solder pad 102 to the distal end 108, thus indicating a defective joint. FIG. 7*b* is a close-up view of a proper solder joint 124. As shown, solder has flowed beyond the second inspection feature 112 from the proximal end 106 of the solder pad 102 to the distal end 108.

As can be seen, the subject disclosure provides many improvements to solder joint 124 inspection systems. For example, without limitation, the use of the first inspection feature 110 and the second inspection feature 112 described herein provide a reliable way to aid an inspector in the visual inspection of a machine in determining whether the solder joint 124 is acceptable. The solder joint 124 inspection system facilitates this inspection process manually and automatically with and without visual magnification. Further, the subject technology can be adapted to any kind of soldering technique.

It will be appreciated by those of ordinary skill in the pertinent art that the functions of several elements can, in alternative embodiments, be carried out by fewer elements, or a single element. Similarly, in some embodiments, any functional element can perform fewer, or different, operations than those described with respect to the illustrated embodiment. Also, functional elements shown as distinct for purposes of illustration can be incorporated within other functional elements in a particular embodiment.

While the subject technology has been described with respect to various embodiments, those skilled in the art will readily appreciate that various changes and/or modifications can be made to the subject technology without departing from the scope of the present disclosure.

What is claimed is:

1. A printed circuit board (PCB) comprising:
a substrate having a surface and at least one solder pad disposed on the substrate surface, the solder pad extending along an axial direction and having an axial length;
a slot formed through the substrate and extending through a distal end portion of the solder pad;
a magnet conductor wire routed through the slot and extending onto the solder pad from the distal end portion toward a proximal end portion of the solder pad, the magnet conductor wire having an end portion disposed on the solder pad, wherein insulation is removed from the end portion prior to placement on the solder pad;
a fiducial marking silkscreened on the substrate surface adjacent to the solder pad, the fiducial marking comprising a non-conductive ink physically separate from metallization of the solder pad, the fiducial marking extending along a transverse direction relative to the axial direction of the solder pad and having an axial length that is less than the axial length of the solder pad;
wherein the fiducial marking is positioned such that the fiducial marking is visually transposed onto the solder pad by projection along the transverse direction to define a contiguous bounded conductor end zone on the solder pad, the conductor end zone being axially spaced from the slot and defining a minimum required axial overlap length of the end portion of the magnet conductor wire on the solder pad; and wherein the end portion of the magnet conductor wire is positioned entirely within the conductor end zone prior to soldering.

2. The printed circuit board of claim 1, wherein the solder pad defines a pair of opposed notches recessed inward from opposing lateral sides of the solder pad at a common axial location between the distal end portion and the proximal end portion, the opposed notches defining a narrowed region of the solder pad that establishes a solder flow boundary, wherein the narrowed region defines a visible axial boundary of solder coverage relative to the distal end portion.

3. The printed circuit board of claim 2, wherein the solder pad includes a first lateral width at the proximal end portion and a second reduced lateral width at the narrowed region defined by the opposed notches, each notch being recessed inward by a distance sufficient to define the reduced lateral width.

4. The printed circuit board of claim 1, wherein the fiducial marking comprises a silkscreened non-conductive ink layer deposited on the substrate surface and having a contrasting color relative to the solder pad and substrate surface to enhance visual detection of the bounded conductor end zone prior to soldering.

5. The printed circuit board of claim 1, wherein the PCB includes a plurality of said solder pads, each solder pad including a respective slot and a respective fiducial marking positioned to define a corresponding conductor end zone, the conductor end zones being aligned along a common axial reference direction across the PCB wherein the PCB.

6. The printed circuit board of claim 1, wherein the magnet conductor wire is preformed to include a bend at a location adjacent to the slot such that, after routing through the slot, the magnet conductor wire lies flush against the substrate surface along the axial direction of the solder pad prior to soldering.

7. A printed circuit board (PCB) comprising:
   a substrate having a surface;
   a solder pad formed as a single continuous metallized region on the substrate surface and extending along an axial direction from a proximal end portion to a distal end portion, the solder pad having a first lateral width measured transverse to the axial direction and defining a longitudinal centerline extending along the axial direction;
   a slot formed through the substrate at the proximal end portion;
   a magnet conductor wire routed through the slot and extending onto the solder pad from the proximal end portion toward the distal end portion; and
   a pair of opposed notches formed in and recessed inward from opposing lateral sides of the solder pad at a common axial location between the proximal end portion and the distal end portion and symmetrically disposed about the longitudinal centerline,
   wherein:
      the opposed notches define a transverse constriction region of the solder pad having a second lateral width that is less than the first lateral width,
      the transverse constriction region extends between the opposing lateral sides of the solder pad and is positioned between ten percent and fifty percent of the axial length of the solder pad measured from the proximal end portion, and
      the transverse constriction region defines a visible axial boundary of solder coverage for visual inspection of solder flow from the proximal end portion toward the distal end portion.

8. The printed circuit board of claim 7, wherein each of the opposed notches has a concave arcuate profile defining a continuous reduction in lateral width from the first lateral width to the second lateral width.

9. The printed circuit board of claim 7, wherein each notch is recessed inward from the respective lateral side by a depth sufficient to reduce the lateral width of the solder pad by at least ten percent relative to the first lateral width.

10. The printed circuit board of claim 7, wherein the opposed notches are aligned across the solder pad at the common axial location located at forty percent of the axial length of the solder pad measured from the proximal end portion.

11. A printed circuit board (PCB) comprising:
   a substrate having a surface;
   a solder pad formed as a single continuous metallized region on the substrate surface and extending along an axial direction from a proximal end portion to a distal end portion, the solder pad having an axial length and a first lateral width measured transverse to the axial direction and defining a longitudinal centerline extending along the axial direction;
   a slot formed through the substrate at the proximal end portion;
   a magnet conductor wire routed through the slot and extending onto the solder pad from the proximal end portion toward the distal end portion, the magnet conductor wire having an end portion disposed on the solder pad;
   a fiducial marking formed on the substrate surface adjacent to the solder pad, the fiducial marking extending along a transverse direction relative to the axial direction of the solder pad and having an axial length less than the axial length of the solder pad, the fiducial marking being positioned such that the fiducial marking is visually transposed onto the solder pad to define a bounded conductor end zone on the solder pad; and
   a pair of opposed notches formed in and recessed inward from opposing lateral sides of the solder pad at a common axial location between the proximal end portion and the distal end portion and symmetrically disposed about the longitudinal centerline of the solder pad,
   wherein:
      the bounded conductor end zone is located axially spaced from the slot and defines an axial overlap region for positioning the end portion of the magnet conductor wire on the solder pad prior to soldering;
      the opposed notches define a transverse constriction region of the solder pad having a second lateral width that is less than the first lateral width;
      the transverse constriction region is located between about thirty percent and about fifty percent of the axial length of the solder pad measured from the proximal end portion; and
      the transverse constriction region defines a visible axial boundary of solder coverage for inspection of solder extending from the proximal end portion toward the distal end portion.

12. The printed circuit board of claim 11, wherein each of the opposed notches has a concave arcuate profile defining a continuous reduction in lateral width from the first lateral width to the second lateral width.

13. The printed circuit board of claim 11, wherein each notch is recessed inward from the respective lateral side by a depth sufficient to reduce the lateral width of the solder pad by at least ten percent relative to the first lateral width.

14. The printed circuit board of claim 11, wherein the opposed notches are aligned across the solder pad at the common axial location located between about thirty percent and about fifty percent of the axial length of the solder pad measured from the proximal end portion.

15. The printed circuit board of claim 11, wherein the fiducial marking comprises a non-conductive ink layer deposited on the substrate surface and providing a contrasting optical appearance relative to the solder pad and the substrate surface to enhance visual inspection of the bounded conductor end zone.

* * * * *